United States Patent [19]

Ichikawa

[11] Patent Number: 5,452,256
[45] Date of Patent: Sep. 19, 1995

[54] INTEGRATED CIRCUIT CARD HAVING IMPROVED POWER EFFICIENCY

[75] Inventor: Tsutomu Ichikawa, Kanagawa, Japan

[73] Assignee: Sony Corporation, Tokyo, Japan

[21] Appl. No.: 358,003

[22] Filed: Dec. 13, 1994

[30] Foreign Application Priority Data

Dec. 25, 1993 [JP] Japan .................................. 5-347601
Dec. 25, 1993 [JP] Japan .................................. 5-347602

[51] Int. Cl.⁶ .............................................. G11C 14/00
[52] U.S. Cl. .................................. 365/226; 365/227; 365/229
[58] Field of Search ............ 365/226, 227, 229, 189.09

[56] References Cited

U.S. PATENT DOCUMENTS

| | | | |
|---|---|---|---|
| 5,016,223 | 5/1991 | Kimura et al. | 365/229 |
| 5,245,582 | 9/1993 | Kimura | 365/229 |
| 5,276,652 | 1/1994 | Anami | 365/227 |

FOREIGN PATENT DOCUMENTS

0129993  6/1987  Japan .................................. 365/227

*Primary Examiner*—David C. Nelms
*Assistant Examiner*—Son Dinh
*Attorney, Agent, or Firm*—Ronald P. Kananen

[57] ABSTRACT

In an integrated circuit card having memory therein, an address detecting circuit and a power supply circuit are provided and the output voltage from the power supply circuits is changed based on address data and supply to a part of the memory, so as to improve the use efficiency of an internal power supply.

10 Claims, 7 Drawing Sheets

| RE | R | A | A' | $V_{CCI} \sim V_{CCO}$ |
|----|---|---|-----|------|
| 1 | * | * | ///  | ON |
| 0 | 1 | * | ///  | OFF |
| 0 | 0 | * | >1 | ON |
| 0 | 0 | * | 0  | OFF |

A': THE NUMBER OF TIMES THAT A SWITCHES TO "1" BETWEEN RESET (R=2) AND WHEN THE CARD BECOMES INACTIVE (RE=0)

| E | V | CONNECTION BETWEEN $V_{cci}$ AND $V_{cco}$ |
|---|---|---|
| 1 | 1 | ON |
| 0 | 1 | ON |
| 1→0 | 1 | ON |
| 1→0 | 0 | OFF |
| 0 | 1 | KEEP THE CONDITION WHEN E : 1→0 |
| 0 | 0 | KEEP THE CONDITION WHEN E : 1→0 |

FIG. 7

| E | V | CONNECTION BETWEEN $V_{cci}$ AND $V_{cco}$ |
|---|---|---|
| 1 | 1 | ON |
| 0 | 1 | ON |
| 0 | 0 | ON |
| 0 | 0 | OFF |

INTEGRATED CIRCUIT CARD HAVING IMPROVED POWER EFFICIENCY

BACKGROUND OF THE INVENTION

1. Field of the Invention

This invention relates to an integrated circuit card, and more particularly to an improvement of integrated circuit card in which a plurality of volatile semiconductor memories are provided within a thin rectangular card together with a battery.

2. Description of the Related Art

Heretofore, this type of integrated circuit cards (hereinafter referred to as "IC cards") have been developed as cashing cards, personnel identification cards for identifying a particular individual, credit cards, and tag cards attached to particular goods for specifying a designation, etc.

This IC card constitutes one system with a card processing device (that is "a card reader"). The IC card is inserted into a part to be inserted of the card reader, and the external connecting terminal of the IC card is electrically connected to the contact in the card reader, so as to be able to read the information in the IC card.

Figure 1:
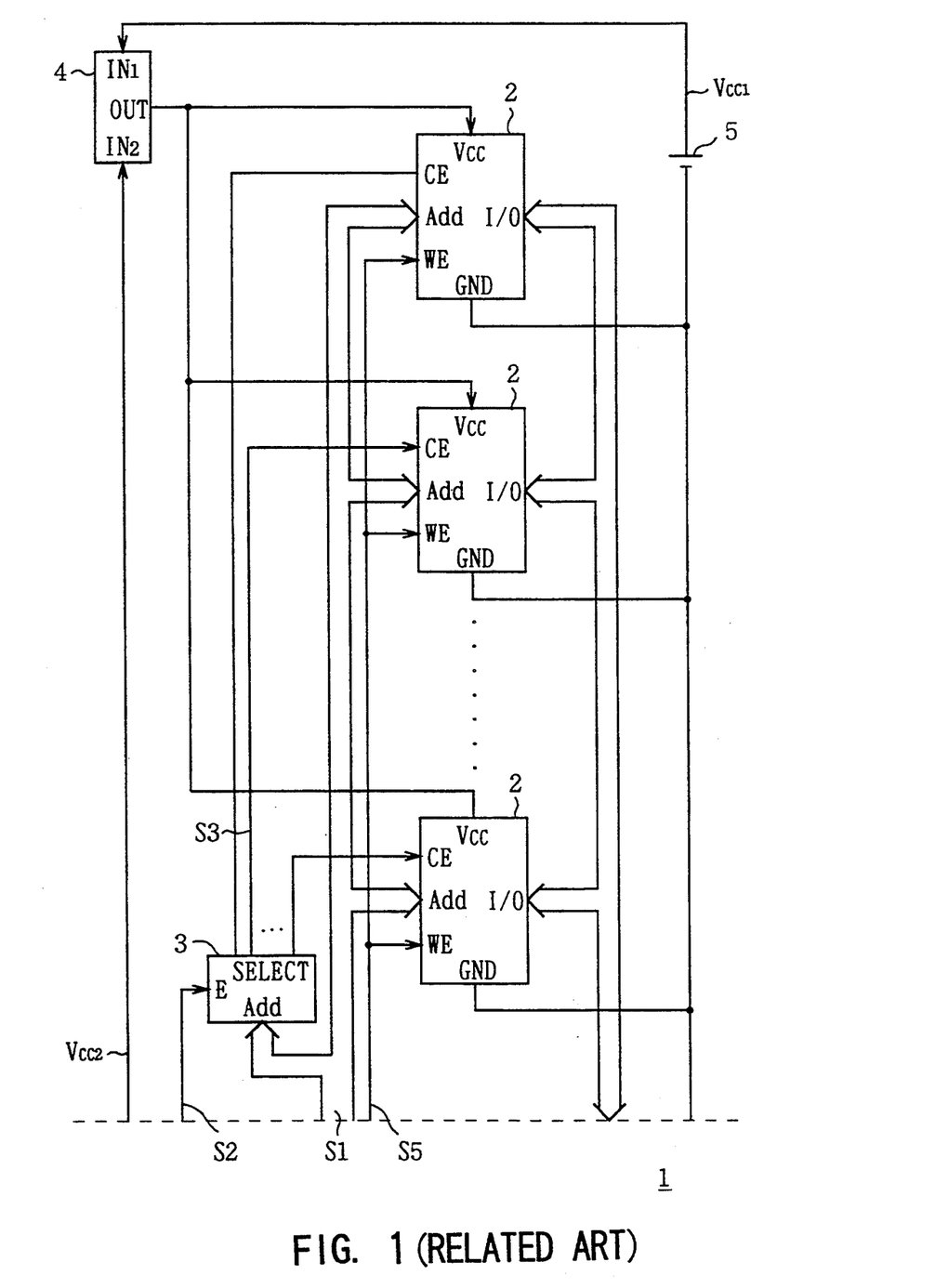
FIG. 1 is a block diagram explaining the internal construction of a conventional IC card.

FIG. 1 shows the internal construction of the IC card in general. The memory section of the IC card 1 has a plurality of random access memories (hereinafter referred to as "RAM") 2 that are volatile semiconductor memories.

In the IC card 1, a part of address input signal S1 is input to a decoder 3 to decode it, and a chip enable signal S3 corresponding to a specified one of the RAM 2 is set to a value "1", so as to select the specified RAM 2 from the memory section. When the IC card 1 becomes usable by being inserted into a card reader (not shown), the decoder 3 detects an enable signal S2 having the basic value "1" which is to be inputted to an input terminal E to be controlled to the active state.

In addition, when the IC card 1 becomes inactive by removing from the card reader, the decoder 3 detects that the enable signal S2 provided to the input terminal E has a logic value "0", so as to switch all the chip enable signal S3 to the value "0". All of the RAM 2 is controlled to enter a deselected state.

Power supply to be supplied to the plural RAM 2 is switch controlled by a power supply switching circuit 4. The power supply switching circuit 4 has two input terminals $IN_1$ and $IN_2$ for inputting supply voltage $V_{CC2}$ of, for example, 5V supplied from the card reader, and voltage $V_{CC1}$ of, for example, 2V supplied from an internal battery 5. The power supply to be supplied to the RAM 2 is switch controlled in accordance with the potential difference between these input terminals $IN_1$ and $IN_2$. If the power supply switching circuit 4 detects that the supply voltage $V_{CC2}$ is inputted, it supplies the supply voltage $V_{CC2}$ from output terminal OUT to the power supply terminal $V_{CC}$ of the RAM 2. If the power supply switching circuit 4 detects that the supply voltage $V_{CC2}$ is not inputted, it supplies the voltage $V_{CC1}$ of the internal battery 5 to the power supply terminal $V_{CC}$ of the RAM 2.

Therefore, when the IC card 1 is inactive because of its separation from a card reader, and the supply voltage $V_{CC2}$ is not supplied, the RAM 2 retain data which has been stored by the voltage $V_{CC1}$ supplied from the internal battery 5. As the internal battery 5, for example, a very thin battery, such as, a paper battery, is used to enable the IC card 1 to have a thickness of 1 or less. The paper battery has a small capacity as a power supply due to its very limited thickness, and is, in effect, used only to retain data in the RAM 2. The life of IC cards thus depend on the life of the internal battery.

However, in the memory section of a conventional IC card 1, all of the RAM 2 have the construction that a power supply is supplied from the internal battery 5, and constantly consume the same amount of current whether or not valid data has been written to the RAM. As a result, there is a problem that the amount of current consumed by the memory section, while the IC card 1 is inactive, increases with the number of RAM 2 mounted in the IC card 1, resulting in a reduced life of the internal battery 5.

More specifically, the conventional IC card 1 has the disadvantage that the data memory time by the RAM 2, that is, the life of the IC card 1, decreases with the increasing number of RAM 2. Another disadvantage of the conventional IC card 1 is that the internal battery 5 is not used efficiently because the RAM 2 consume the same amount of current whether or not valid data has been written to the RAM 2.

As a method for solving this problem, it is considered to recharge the internal battery 5 when its life has expired. However, this solution is inadequate because the recharge frequency and thus the needless bother increase with the number of RAM 2, and users generally have difficulty in replacing the batteries 5 in such IC cards 1.

To eliminate this disadvantage, an internal battery 5 with a large capacity can be employed. In this case, however, it is difficult to provide a thin card because the battery must be large to have a large capacity, and the thickness of the IC card is dependent upon the size of the internal battery.

SUMMARY OF THE INVENTION

In view of the foregoing, an object of this invention is to provide an integrated circuit card having a plurality of volatile memory means therein, for significantly improving the use efficiency of an associated internal power supply while a power is not supplied from an external source.

The foregoing object and other objects of the invention have been achieved by the provision of an integrated circuit card incorporating a plurality of volatile memory means, comprising: an internal power supply for supplying a predetermined voltage to the volatile memory means; decoding means for decoding an input address input signal and outputting a chip selection signal for selecting a specified one of a plurality of the volatile memory means; and power supply control means placed between the internal power supply and the volatile memory means, for controlling the internal power supplied to the selected volatile memory means in response to an operation enable signal and the chip selection signal for selecting the specified volatile memory means, wherein the internal power is only supplied to the volatile memory means which has been selected by the decoding means.

Further, this invention provides an integrated circuit card incorporating a plurality of volatile memory means, comprising: an internal power supply for supplying a predetermined voltage to the volatile memory means; decoding means for decoding an input address input signal and outputting a chip selection signal for selecting a specified one of a plurality of the volatile memory means; and power supply control means placed between the internal power supply and the volatile memory means, for controlling the internal power supplied to the selected volatile memory means in response to an operation enable signal, the chip selection signal for selecting the specified volatile memory means, and a write enable signal used to write information to the selected volatile memory means, wherein the internal power is only supplied to the volatile memory means selected by the decoding means and to which the information has been written.

The power supply control means 12 connected to the volatile memory means 2 not selected by the decoding means 3 for decoding address input signal S1 forbids internal power supply $V_{CC1}$ to be supplied to these volatile memory means 2, when power supply $V_{CC2}$ is not supplied from the outside of IC card, thereby reducing the amount of current required to retain the memory of the plurality of volatile memory means 2 to improve the efficiency of power supply $V_{CC1}$ within the IC card.

Further, this invention provides an integrated circuit card incorporating a plurality of volatile memory means, comprising: an internal power supply for supplying a predetermined voltage to the volatile memory means; decision means for deciding the volatile memory means having information stored therein and for outputting a decision signal, based on the memory area information showing which memory area of the volatile memory means the information is stored in or which volatile memory means of a plurality of the volatile memory means the information is stored in; and power supply control means placed between the power supply and the volatile memory means, for controlling the internal power supplied to the volatile memory means in response to an operation enable signal and the decision signal for deciding the volatile memory means, wherein the internal power is only supplied to the volatile memory means storing the information.

The power supply control means 12 connected to the volatile memory means 2 decided based on memory area information S9 that the decision means 25 does not store the specified information do not connect power $V_{CC1}$ within the information card to these volatile memory means 2 when external power supply $V_{CC2}$ is not supplied, thereby reducing the amount of current required to retain the memory of the plurality of volatile memory means 2 to improve the efficiency of internal power supply $V_{CC1}$.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Preferred embodiments of this invention will be described with reference to the accompanying drawings:

A first embodiment of this invention will be described with reference to the drawings.

Figure 2:
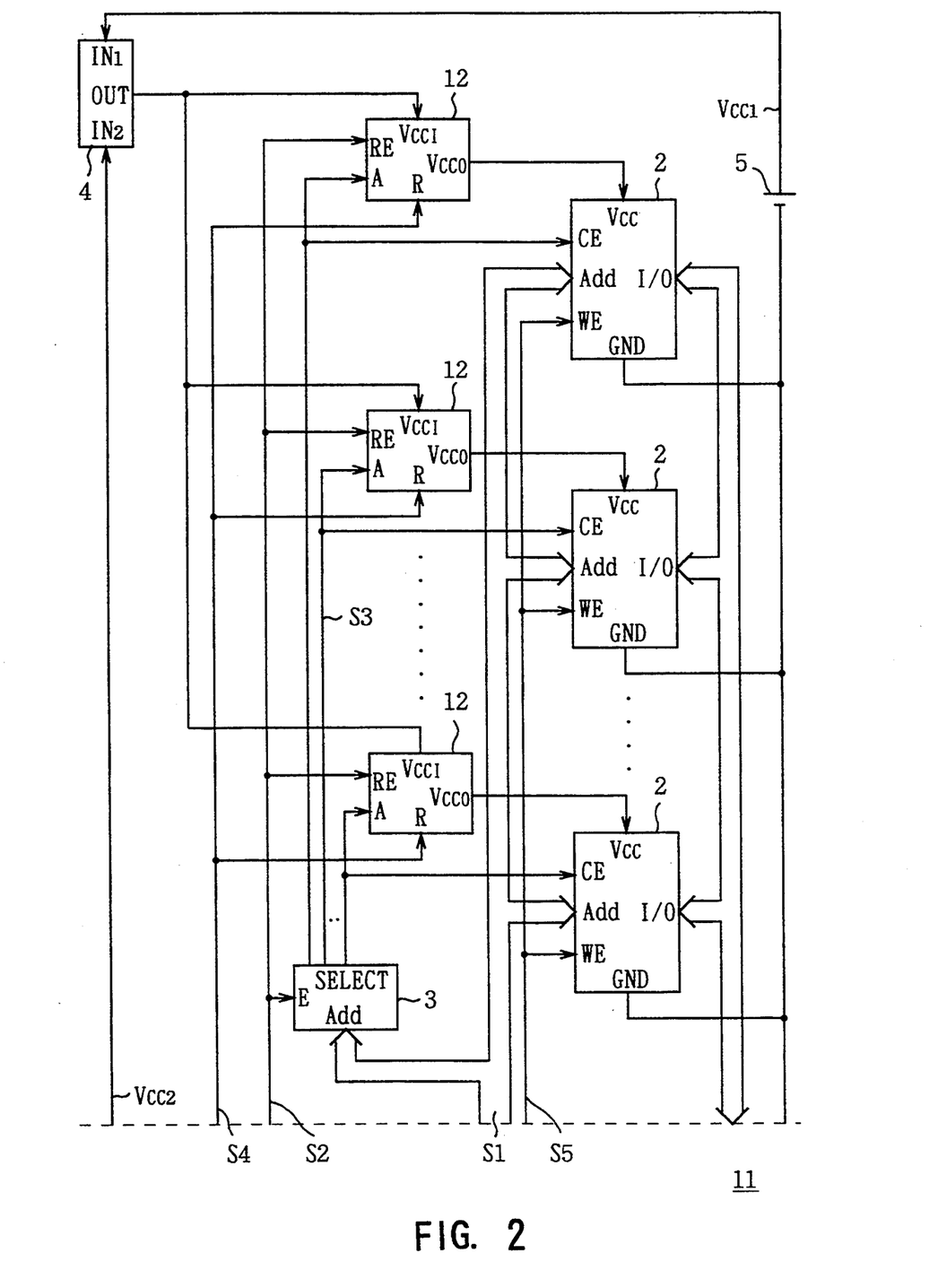
FIG. 2 is a block diagram illustrating a first embodiment of an IC card according to this invention.

In FIG. 2 in which the corresponding components are designated by the same reference numerals as in FIG. 1, 11 generally shows an IC card having the function which can independently control the supplying of power to a RAM 2. The IC card 11, to obtain this function, comprises power supply circuits 12 for storing the history of the RAM 2 and determining the supply of power, which are placed between a power supply switching circuit 4 and respective RAM 2.

Figure 3:
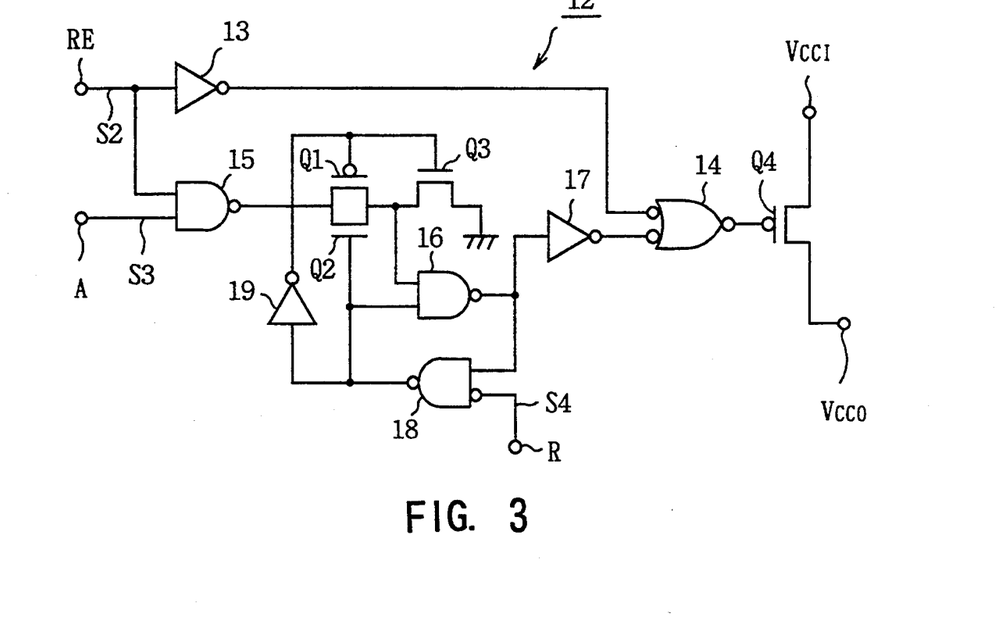
FIG. 3 is a circuit diagram illustrating the configuration of a power supply circuit shown in FIG. 2 which is a second embodiment according to this invention.

The power supply circuits 12 according to a second embodiment comprises, for example, CMOS circuits, as shown in FIG. 3. The power supply circuit 12 inputs enable signal S2 to an inversion circuit 13 via input terminal RE and then supplies to the first inversion input of a two-input NOR circuit 14. The power supply circuit 12 also inputs the enable signal S2 to a two-input NAND circuit 15 as first condition input.

Chip enable signal S3 is input to the NAND circuit 15 via input terminal A as a second condition input, and its output is supplied to MOS transistor Q3 via MOS transistors Q1 and Q2 which are connected to a common drain and a common source.

The common connection point between transistors Q1, Q2 and transistor Q3 is connected to the first input of a two-input NAND circuit 16. The output of the NAND circuit 16 is input to the second inversion input of the NOR circuit 14 via an inversion circuit 17, and also input to the input of a two-input NAND circuit 18. The NAND circuit 18 inputs reset signal S4 to its inversion input via input terminal R, and its output is supplied to the second input of the NAND circuit 16 and the gate of transistor Q2.

The NAND circuit 18 also supplies its output to the inversion input gate of transistor Q1 and non-inversion input gate of transistor Q3 via an inversion circuit 19. The output of the NOR circuit 14 is passed to the inversion input gate of MOS transistor Q4. Transistor Q4 is placed between input terminal $V_{CCI}$ connected to output terminal OUT of the power supply switching circuit 4 and output terminal $V_{CCO}$ connected to power input terminal $V_{CC}$ of the corresponding RAM 2.

The decoder 3, the power supply circuits 12, and a circuit (not shown) for generating enable signal S2 and reset signal S4 passed to the decoder 3 and the power supply circuits 12 from the outside of the memory section (RAM 2), respectively, are formed on the same chip of card reader side as a microcomputer for controlling the RAM 2.

Figure 4:
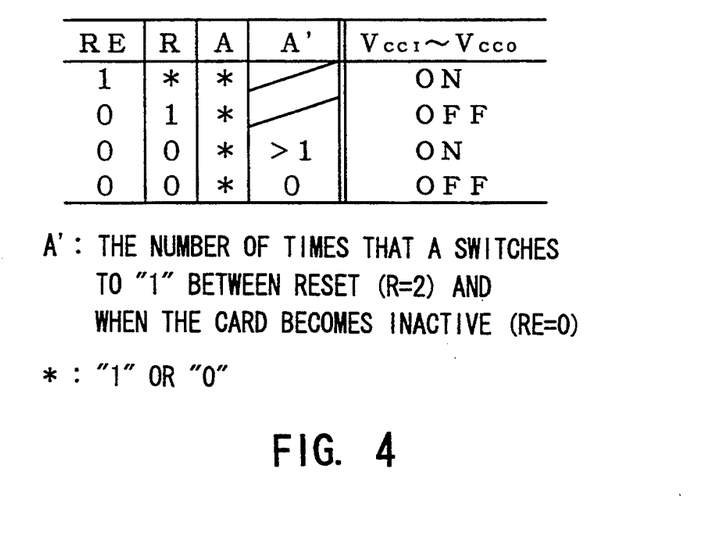
FIG. 4 is a truth table showing the state of the connection between an input terminal VCCI and an output terminal $V_{CCO}$ depending on the operation of the device according to the invention.

In the above configuration, the power supply operation by the power supply circuit 12 will be explained in accordance with the truth table shown in FIG. 4. The power supply circuit 12 turns power on or off between input terminal $V_{CCI}$ and output terminal $V_{CCO}$ in response to a combination of enable signal S2, chip enable signal S3, and reset signal S4 input to the input terminals RE, A, and R.

That is, when the IC card 1 is removed from the card reader and becomes inactive, thereby the supply of supply voltage $V_{CC2}$ to the card is to be stopped, and enable signal S2 with a value of "0" is provided, the power supply circuit 12 is reset to turn off the power between input terminal $V_{CCI}$ and output terminal $V_{CCO}$ when the value of the reset signal S4 becomes "1". This causes all of the RAM 2 to have power supply input terminal $V_{CC}$ disconnected from output terminal OUT and to be no longer supplied with supply voltage $V_{CC1}$ from the internal battery 5 in the IC card 11.

In addition, when the IC card 11 is inserted into the card reader and becomes active, and the power $V_{CC2}$ is supplied and enable signal S2 with a value of "1" is supplied to the power supply circuit 12, the circuit turns on the power between input terminal $V_{CCI}$ and output terminal $V_{CCO}$. This causes all of the RAM 2 to have power supply input terminal $V_{CC}$ connected to output terminal OUT of the power supply switching circuit 4 and to be supplied with supply voltage $V_{CC2}$.

Furthermore, if the output of the decoder 3, that is, chip enable signal S3 has the value of "1" and one of the RAM 2 is selected, the power supply circuit 12 connected to that RAM 2 stores the selection. Consequently, this RAM 2 has power supply input terminal $V_{CC}$ remain connected to output terminal OUT and continued to supply with supply voltage $V_{CC1}$ from the internal battery 5, even if the card becomes inactive, to prevent the supply of supply voltage $V_{CC2}$ and the enable signal S2 with the value of "0" is provided to the RAM 2.

However, if chip enable signal S3 to a RAM 2 remains "0" to prevent this RAM 2 from being selected, the card becomes inactive to prevent the supply of supply voltage $V_{CC2}$, and enable signal S2 with the value of "0" is passed to this RAM 2, the RAM 2 has power supply input terminal $V_{CC}$ disconnected from output terminal OUT and is no longer supplied with supply voltage $V_{CC1}$.

With this configuration, when the IC card 11 is disconnected from the card reader and prevented from being supplied with supply voltage $V_{CC2}$, the power supply circuits 12 connected to the RAM 2 not selected by the decoder 3 for decoding address input S1 do not connect these RAM to the internal battery 5, thereby reducing the amount of current required to retain the memory of a plurality of RAM 2.

Since the amount of current required to retain data stored in the RAM 2 when the card is inactive can be adjusted based on whether or not the RAM 2 have been selected, the amount of current consumed by the internal battery 5 is reduced and thereby substantially increases the memory retention time compared to the prior art and to facilitate the efficient use of the internal battery 5.

In the above embodiment, supply voltage $V_{CC1}$ is supplied from the internal battery 5 to the RAM 2 in which valid data has been written or to the RAM 2 which has been selected. However, this invention is not only limited to this, but supply voltage $V_{CC1}$ from the internal battery 5 may be only supplied to the RAM 2 to which valid data has been written. In this case, the memory retention current from the internal battery 5 can be further reduced compared to the above embodiment.

Next, a third embodiment of this invention is explained below.

Figure 5:
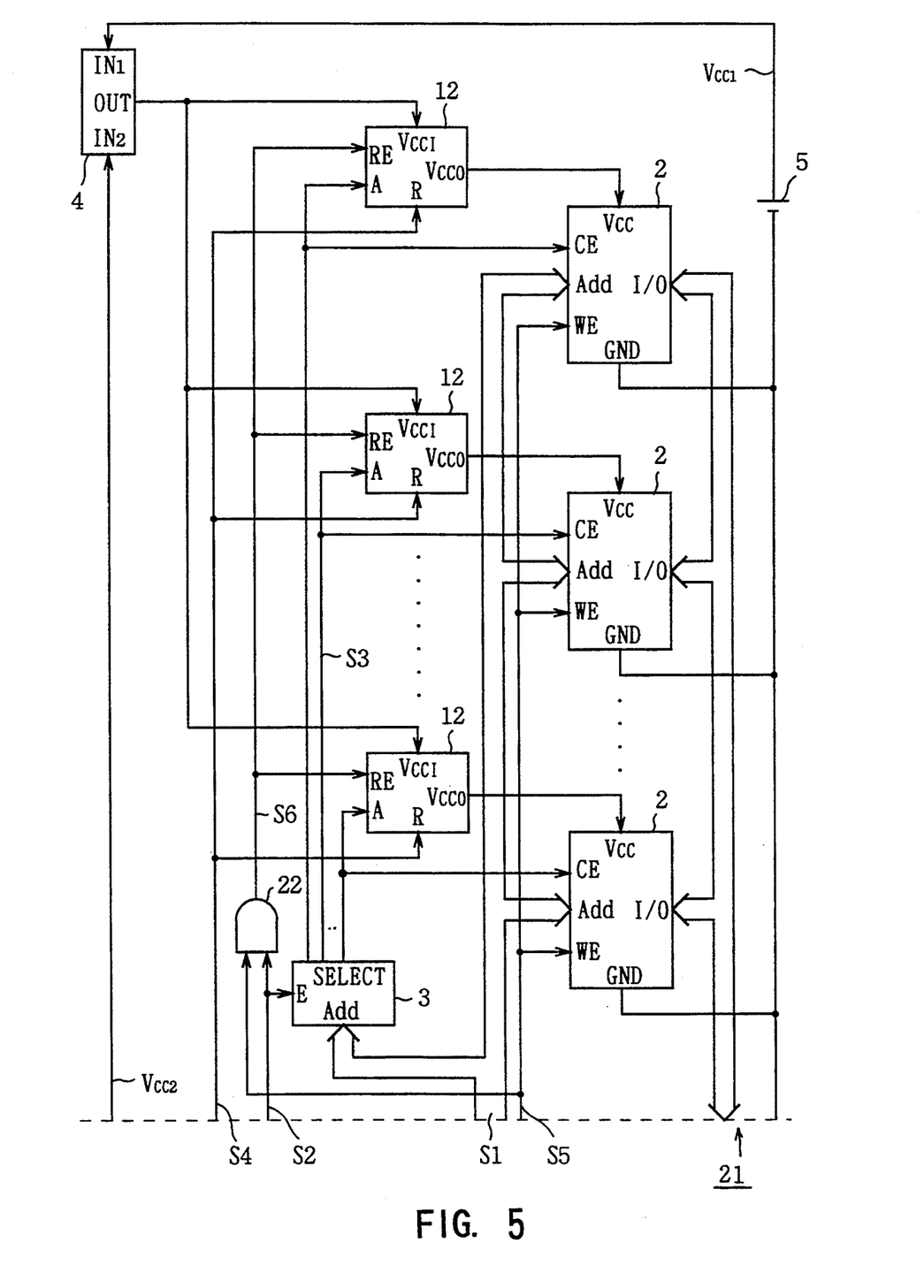
FIG. 5 is a block diagram illustrating an IC card according to a third embodiment.

As shown in FIG. 5, the IC card 21 has a two-input AND circuit 22. The AND circuit 22 outputs signal S6, that is the logical product of enable signal S2 and write enable signal S5 for the RAM 2, to input terminal RE of the power supply circuits 12.

This only allows the determination of the RAM 2 to which valid data has been written, and these RAM 2 have power supply input terminal $V_{CC}$ connected to the internal battery 5 even when the card is inactive. However, the RAM 2 to which valid data has not been written do not have power supply input terminal $V_{CC}$ connected to the internal battery 5 when the card is inactive, thereby preventing the waste consumption of standby current.

The decoder 3, power supply circuits 12, AND circuit 22, and a circuit (not shown) for generating enable signal S2, reset signal S4, and write enable signal S5 to be supplied to the decoder 3, power supply circuits 12, AND circuit 22, and RAM 2, respectively, are formed on the same chip as a microcomputer for controlling the RAM 2.

In the above embodiment, the IC card 21 is supplied with supply voltage $V_{CC2}$ from the card reader via an external connecting terminal. However, this invention is not only limited to this, but the IC card does not have an external connecting terminal but may be supplied externally with supply voltage $V_{CC2}$ in an arbitrary manner.

As described above, this invention implements an IC card, in which the power supply control means connected to the volatile memory means not selected by decoding means for decoding an address input signal do not supply internal power supply to these volatile memory means when external power of the IC card is not supplied, thereby reducing the amount of current required to retain the memory of a plurality of volatile memory means and improving the use efficiency of the power supply within the IC card.

A fourth embodiment of this invention is described with reference to FIG. 6.

Figure 6:
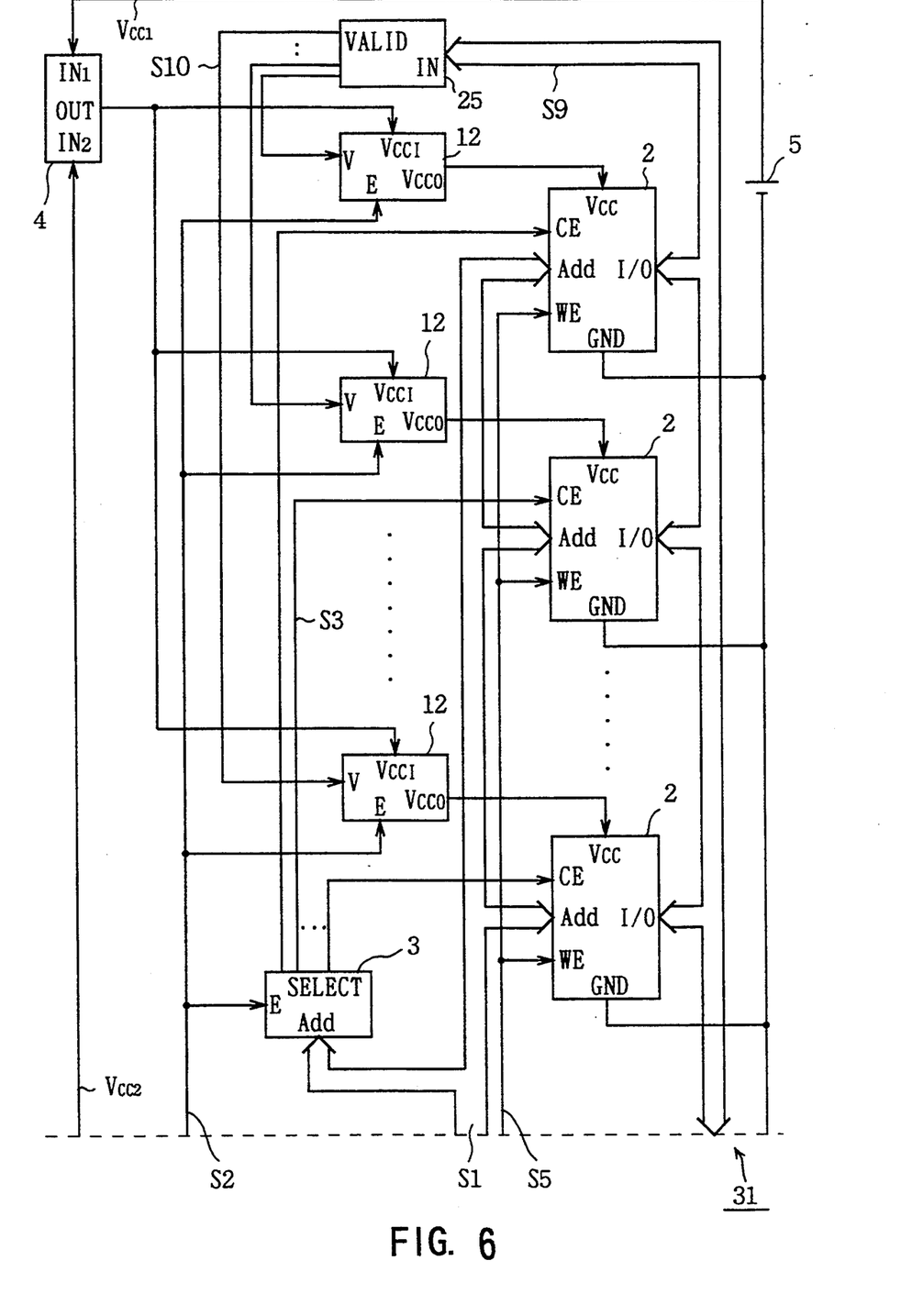
FIG. 6 is a block diagram illustrating a fourth embodiment of an IC card according to this invention.

In FIG. 6 in which the corresponding components is designated by the same reference numerals as in FIG. 1, 31 generally shows an IC card, and is similar to the construction in FIG. 1, excepting the addition of a selector 25 and the power supply circuits 12. Here, the power supply circuits 12 are placed between a power supply switching circuit 4 and respective RAM 2.

The value of a pointer S9 showing up to which memory area (address) of the RAM 2 the valid data which is stored in the RAM 2 exists or up to which RAM 2 the valid data exists is input to a selector 25 via the I/O data bus. The selector 25 outputs supply control signal S10 with a value of "1" from output terminal VALID to the power supply circuits 12 which are connected to the RAM 2 storing valid data, based on the value of pointer S9, and causes the power supply circuits 12 to supply power $V_{CC2}$ or $V_{CC1}$. In contrast, the selector 25 outputs supply control signal S10 with a value of "0" to the power supply circuits 12 which are connected to the RAM 2 not storing valid data.

Figure 7:
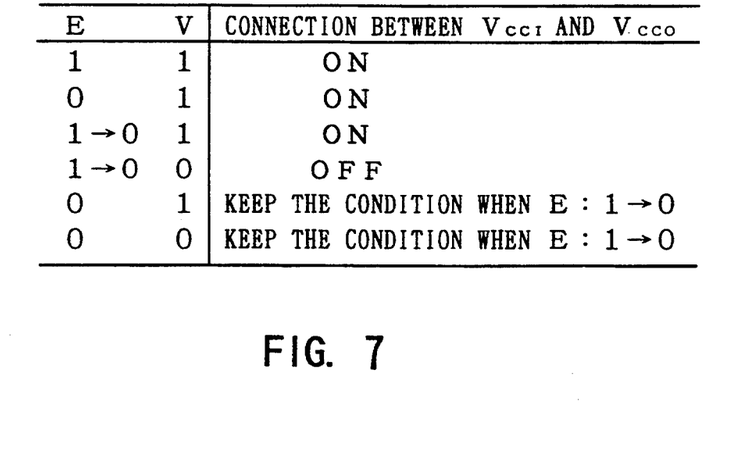
FIG. 7 is a truth table showing the state of the connection between input terminal $V_{CCI}$ and output terminal $V_{CCO}$ depending on a selector of the embodiments.

The power supply circuits 12 turn the power between input terminal $V_{CCI}$ and output terminal $V_{CCO}$ on and off in response to the combination of logical levels of supply control signal S10 and enable signal S2 which are input to the input terminals V and E according to the truth table shown in FIG. 7.

In the above configuration, the value of pointer S4 is updated each time data is written to the IC card or data on the IC card is erased, and is read out from the RAM 2 and input to the selector 25 before the IC card is removed from the card reader and becomes inactive. Supply control signal S10 with the value of "0" is input to the power supply circuits 12 from the selector 25 in the case where no valid data exists on the RAM 2. Thus, the supply voltage $V_{CC1}$ of the internal battery 5 to the RAM 2 not storing valid data is cut off when the IC card becomes inactive.

With this configuration, when the IC card is disconnected from the card reader and prevented from being supplied with supply voltage $V_{CC2}$, the power supply circuits 12 connected to the RAM 2 decided based on pointer S9 that the selector 25 does not store valid data do not connect these chips to the internal battery 5, thereby reducing the amount of current required to retain the memory of a plurality of RAM 2.

Since the consumed amount of current can be adjusted based on whether or not the RAM 2 incorporated on the card store valid data when the card is inactive, the amount of current consumed by the internal battery 5 is reduced and thereby substantially increases the memory retention time compared to the prior art and to facilitate the efficient use of the internal battery 5.

In the above embodiment, the value of the pointer S9 in the RAM 2 is updated each time data is written to the IC card or data on the card is erased, and is read out from the RAM 2 and input to the selector 25 before the card is made inactive. However, this invention is not only limited to this, but a register used exclusively for storing the value of pointer S9 is connected to the selector 25 and the value of pointer S4 may be read out from this register. Even in this case, a similar effect such as that mentioned above can be obtained.

Next, a fifth embodiment of this invention is described below.

Figure 8:
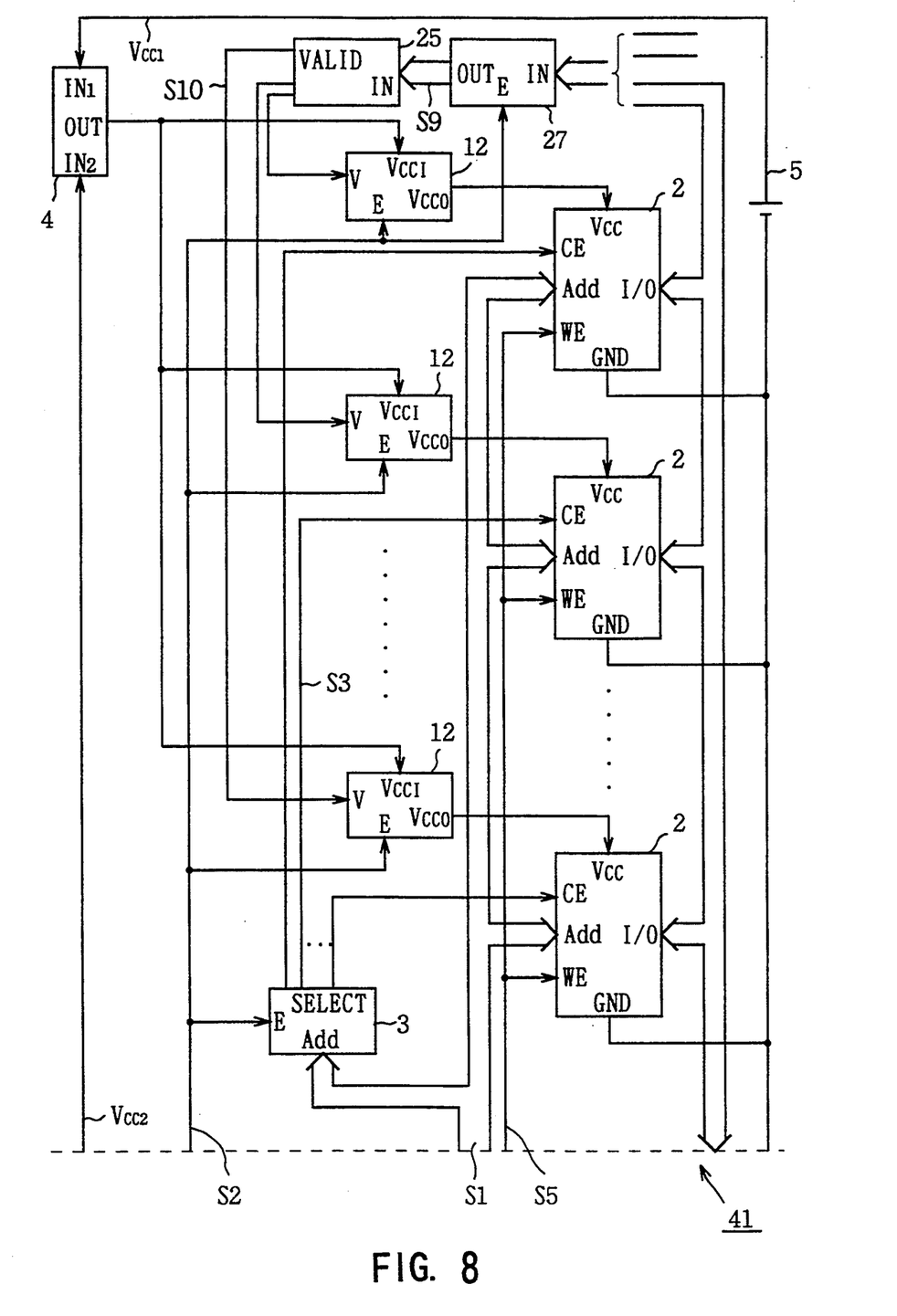
FIG. 8 is a block diagram explaining an IC card according to a fifth embodiment of this invention.

As shown in FIG. 8, in the IC card 41, a register 27 is placed between the I/0 data bus and the selector 25. The value of the pointer S9 is input to the selector 25 via the I/O data bus or the data bus of the system for processing the external IC card of the card reader or the like. The value is updated every time data is written to the RAM 2 or the data is erased.

The value is written to the register 27 by the address signal or the data signal according to the system for processing the card. Moreover, the register 27 retains the value at that time when the card becomes inactive and enable signal S2 with a value of "0" is input to input terminal E.

Figure 9:
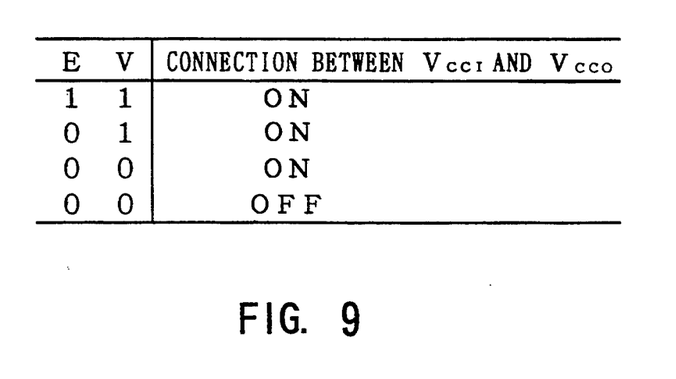
FIG. 9 is a truth table showing the state of the connection between input terminal $V_{CCI}$ and output terminal $V_{CCO}$ depending on the selector of the embodiment shown in FIG. 8.

The power supply circuits 12 used in this embodiment operates according to the truth table shown in FIG. 9. Thus, when the IC card becomes inactive, the connection of the internal battery 5 with the RAM 2 in which valid data is not written is cut off.

In the above embodiment, the IC card 41 have a pointer S9. However, the invention is not only limited to this, but the IC card 41 may have a plurality of pointers depending on the system. In this case, a plurality of selectors 25 or a plurality of selectors 25 and a plurality of registers 27 are provided and the logical ORing of the signals output from output terminal VALID of each selector 25 is input to input terminal V of each power supply circuit 12.

In this connection, the selector 25, register 27, and power supply circuits 12 consist of a digital circuit and a switching means, such as MOS transistors, bipolar transistors, and relays, for example, interlocked therewith.

In the above embodiment, the IC card is supplied with supply voltage $V_{CC2}$ from the card reader via an external connecting terminal. However, this invention is not only limited to this, but the IC card does not have an external connecting terminal but may be supplied externally with supply voltage $V_{CC2}$ in an arbitrary manner.

As described above, this invention implements an IC card, in which the power supply control means connected to the volatile memory means decided based on the memory area information that a decision means does not store specified information do not connect power within the IC card to these volatile memory means, when external power of the IC card is not supplied, thereby reducing the amount of current required to retain the memory of a plurality of volatile memory means and improving the efficiency of the internal power supply.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. An integrated circuit card incorporating a plurality of volatile memory means, comprising:

an internal power supply for supplying a predetermined voltage to said volatile memory means;

decoding means for decoding an address input signal and outputting a chip selection signal for selecting a specified one of a plurality of said volatile memory means; and power supply control means placed between said internal power supply and said volatile memory means, for controlling the predetermined voltage supplied to the selected volatile memory means in response to an operation enable signal and said chip selection signal for selecting the specified volatile memory means, wherein said predetermined voltage is only supplied to said volatile memory means which has been selected by said decoding means.

2. An integrated circuit card incorporating a plurality of volatile memory means, comprising:

an internal power supply for supplying a predetermined voltage to said volatile memory means;

decoding means for decoding an address input signal and outputting a chip selection signal for selecting a specified one of a plurality of said volatile memory means; and power supply control means placed between said internal power supply and said volatile memory means, for controlling the predetermined voltage supplied to the selected volatile memory means in response to an operation enable signal, said chip selection signal for selecting the specified volatile memory means, and a write enable signal used to write information to the selected volatile memory means, wherein said predetermined voltage is only supplied to said volatile memory means selected by said decoding means and to which said information has been written.

3. The integrated circuit card according to claim 1 or 2 comprising, signal generation means for generating a reset signal provided to said power supply control means for stopping the supply of said predetermined voltage to said volatile memory means.

4. The integrated circuit card according to claim 3 further comprising, a semiconductor chip wherein a part of or all of memory control means for controlling said volatile memory means is formed on said semiconductor chip, and wherein at least one of said decoding means, said power supply control means, and said signal generation means is formed on said semiconductor chip.

5. An integrated circuit card incorporating a plurality of volatile memory means, comprising:

an internal power supply for supplying a predetermined voltage to said volatile memory means;

decision means for determining which areas of said volatile memory means have information stored therein and for outputting a decision signal, based on memory area information showing in which areas of said volatile memory means said information is stored or in which particular ones of said plurality of said volatile memory means said information is stored; and power supply control means placed between said power supply and said volatile memory means, for controlling power supplied to the volatile memory means in response to an operation enable signal and said decision signal, wherein said predetermined voltage is only supplied to said volatile memory means which store said information.

6. The integrated circuit card according to claim 5, wherein said memory area information is stored in a part of the memory area of said volatile memory means.

7. The integrated circuit card according to claim 5 wherein each one of said plurality of volatile memory means store said information independently with respect to each other.

8. The integrated circuit card according to claim 5 or 6 further comprising, signal generation means for generating an address input signal or said operation enable signal.

9. The integrated circuit card according to claim 5 or 6 comprising, a semiconductor chip wherein at least one of said decision means, said power supply control means, and said volatile memory means is formed on said semiconductor chip.

10. The integrated circuit card according to claim 8, wherein at least one of said decision means, said power supply control means, and said volatile memory means is formed on a semiconductor chip.

* * * * *